(12) United States Patent
Matsumoto (10) Patent No.: US 7,382,214 B2
(45) Date of Patent: Jun. 3, 2008

(54) PRINTED BOARD (75) Inventor: Takehide Matsumoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 184 days.

(21) Appl. No.: 11/229,260

(22) Filed: Sep. 15, 2005

(65) Prior Publication Data
US 2006/0061433 A1 Mar. 23, 2006

(30) Foreign Application Priority Data
Sep. 21, 2004 (JP) .............................. 2004-273809

(51) Int. Cl.
H01R 13/648 (2006.01)
H03H 7/38 (2006.01)
(52) U.S. Cl. .................... 333/33; 333/260; 439/607; 439/608
(58) Field of Classification Search .................. 333/32, 333/33, 260; 439/607, 608, 108; 438/607, 438/608
See application file for complete search history.

(56) References Cited

U.S. PATENT DOCUMENTS 5,507,655 A * 4/1996 Goerlich ..................... 439/108
2002/0132525 A1* 9/2002 Tanaka ........................ 439/608

FOREIGN PATENT DOCUMENTS

JP 2002-270307 9/2002

* cited by examiner

Primary Examiner—Stephen E Jones
(74) Attorney, Agent, or Firm—Edwards Angell Palmer & Dodge LLP

(57) ABSTRACT

A printed board includes: an impedance matching member disposed along the periphery of a plurality of connecting pins for connecting a connector to signal lines on the printed board, the plurality of connecting pins being arranged in row and column directions; and a connecting portion for connecting the impedance matching member to a ground line of the printed board. The printed board according to the present invention is capable of suppressing the impedance mismatching of an ordinary connector having no special shield or the like for impedance matching.

10 Claims, 8 Drawing Sheets

PRINTED BOARD

CROSS-REFERENCE TO RELATED APPLICATION

This application is related to Japanese Patent Application No. 2004-273809 filed on Sep. 21, 2004, whose priority is claimed and the disclosure of which is incorporated by reference in its entirety.

BACKGROUND OF THE INVENTION

1. Field of the Invention

The present invention relates to a printed board having an impedance matching member between the printed board and connecting pins for connecting the printed board and a connector.

2. Description of Related Art

As the operating frequency of the electronic circuits increases, it becomes more important to provide characteristic impedance matching between circuits and between nodes in order to maintain excellent transmission characteristics of high-frequency signals and high-speed signals. Circuits, devices or components inside the devices are connected to each other using connectors and cables. It is therefore necessary that a design of signal lines between a connector and a printed board be made in view of the impedance matching. Signal lines such as microstrip lines, strip lines and coplanar lines provided on a printed board are designed to match impedances in accordance with the configuration of the signal lines and the positional relationship with a ground line. However, in some cases, connecting pins between a connector and signal lines on a printed board are exposed in the air with no ground line corresponding thereto. This makes it difficult to provide sufficient impedance matching.

For example, in a horizontal connector mounted on a printed board so that connecting pins extends horizontally, the connecting pins extending from the connector are bent at an almost right angle to be connected to the printed board and exposed in the air. Such exposed portions of the pins have high impedance, causing impedance mismatches to occur between the pins and the signal lines on the printed board. This results in a problem that transmission characteristics of high-frequency signals and high-speed signals significantly degrade due to signal loss, pulse distortion or the like caused by the impedance mismatching.

The connecting pins bent at an almost right angle have different impedances at inside and outside of the bent portions.

Figure 12:
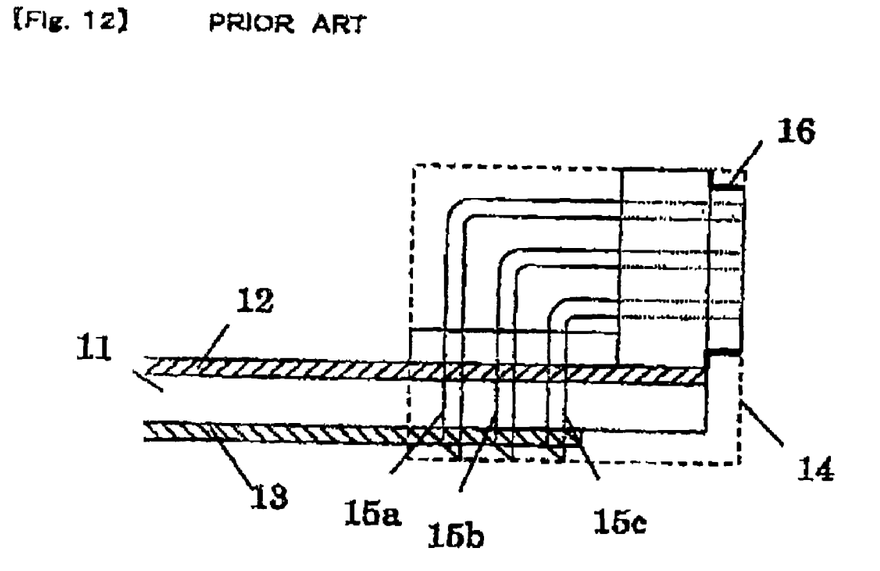
FIG. 12 is an explanatory view illustrating connection of a printed board to a connector.
Figure 13:
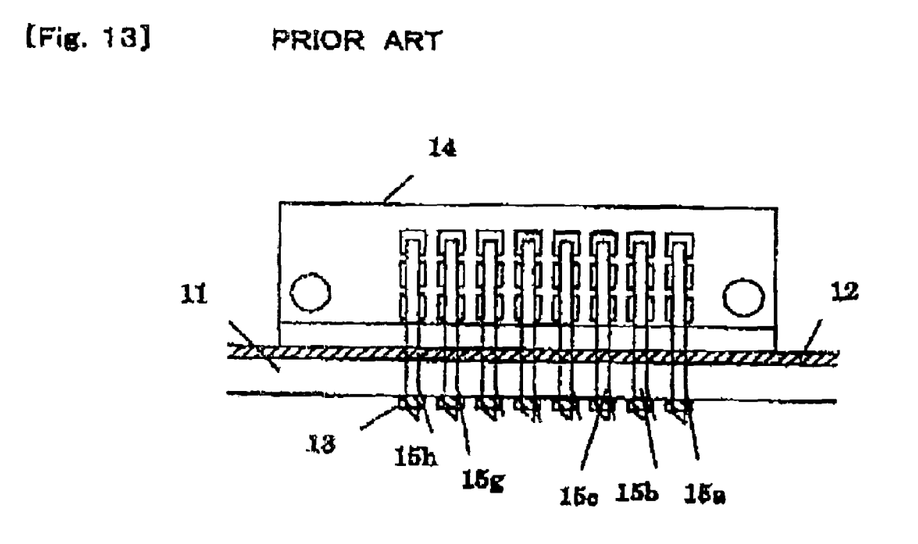
FIG. 13 is a view of the printed board and connector of FIG. 12 as seen from the rear side of the connector.

FIG. 12 is a cross-sectional view of a connector 14 mounted in a horizontal orientation on a printed board 11. FIG. 13 is a view of the same portion as seen from the rear side of the connector. The printed board 11 has a ground line 12 provided on one surface thereof and signal lines 13 such as microstrip lines, strip lines, coplanar lines or the like provided on the other surface. The connector 14 has a shield case attached thereto near its connection to a cable. The shield case 16 is fixed to the printed board 11. The connector 14 has a connecting portion for connection to the cable and a plurality of connecting pins 15a, 15b and so on extending from the connecting portion. The connecting pins 15a, 15b and so on are soldered to the signal lines 13 of the printed board 11.

When the connecting pins 15a, 15b and so on of the connector 14 are thus connected to the printed board 11, the pins are exposed in the air except for the portions covered with the shield case 16. Such exposed portions have various impedances, and variations in impedance are greater in the outermost pin having the largest exposed portion than in the inner pins. Particularly, there is a variation in common mode impedance (impedance with respect to the ground line), and thereby common mode reflection occurs.

Japanese Unexamined Patent Publication No. 2002-270307 solves such problems by disposing a shielding member near the exposed portions of the connecting pins 15a, 15b and so on to prevent impedance mismatching.

The structure disclosed by the aforementioned patent publication has the shielding member disposed inside the connector, which limits portions where the shielding member can be disposed and makes molding of the shielding member complicated because the shape of the shielding member needs to conform to the shape inside the connector. This results in production of waste during the preparation of shielding member, an increase in time for attachment of the shielding member and an increase in cost.

SUMMARY OF THE INVENTION

According to an aspect of the invention, provided is a printed board comprising: an impedance matching member disposed along the periphery of a plurality of connecting pins for connecting a connector to signal lines on the printed board, the plurality of connecting pins being arranged in row and column directions; and a connecting portion for connecting the impedance matching member to a ground line of the printed board. The printed board according to the present invention is capable of suppressing the impedance mismatching of an ordinary connector having no special shield or the like for impedance matching.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

A printed board according to the present invention comprises: an impedance matching member disposed along the periphery of a plurality of connecting pins for connecting a connector to signal lines on the printed board, the plurality of connecting pins being arranged in row and column directions; and a connecting portion for connecting the impedance matching member to a ground line of the printed board.

According to the present invention, the impedance matching member is preferably in the form of a conductive plate, rod or net. Furthermore, the signal lines on the printed board are preferably microstrip lines, strip lines or coplanar lines.

In accordance with the present invention, the distance s between the impedance matching member and an outermost connecting pin may be defined by the following equation 1:

$$s = 0.1675(0.8w + t)e^{\frac{Z_0}{56.07}} \quad (1)$$

wherein $Z_0$ is an impedance of the outermost connecting pin when the impedance matching member is used, t is a dimension in vertical direction of the outermost connecting pin, and w is a dimension in horizontal direction of the outermost connecting pin.

In the printed board according to the present invention, the ground line may be provided on a surface of the printed board on which the connector is mounted and the signal lines may be provided on the opposite surface of the printed board. Furthermore, the impedance matching member may be disposed with respect to some of the connecting pins.

According to the present invention, the connector may include a shield case connected to the ground line of the printed board, and the impedance matching member may be connected to a side of the shield case opposite to the side connected to the ground line.

The signal lines may be provided on a side of the printed board on which the connector is mounted, and when disposed above the signal lines, the impedance matching member may straddle the signal lines.

The connector may be a horizontal connector mounted in a horizontal orientation so that a cable line connected to the connector is parallel to the printed board.

Furthermore, the plurality of connecting pins may be bent between the connector and the printed board, and the impedance matching member may be bent along the bend of outermost connecting pins.

According to the present invention, the impedance matching member connected to the ground line of the printed board is disposed along the periphery of the plurality of connecting pins for connecting the connector and the signal lines on the printed board. This eliminates the impedance mismatching of the connecting pins and further eliminates signal loss and degradation in transmission characteristics caused by the impedance mismatching. Particularly, the impedance mismatching of the outermost connecting pins is eliminated, and the difference in impedance between outer and inner pins can be reduced.

In the printed board according to the invention, the impedance matching member is in the simple form of a conductive plate, rod or net, and attachment of the impedance matching member is easy. Thus, the impedance matching member can be fabricated at low cost, allowing inexpensive, high-quality products to be provided to consumers. Furthermore, the impedance matching member can be disposed for only the essential connecting pins.

Since the signal lines on the printed board are microstrip lines, strip lines or coplanar lines, the present invention can be used as a connector for superhigh frequency signals.

According to the present invention, the distance s between the impedance matching member and the outermost connecting pin can be defined by the aforementioned equation 1, and thereby designing of the printed board is easy.

Embodiment 1

Figure 1:
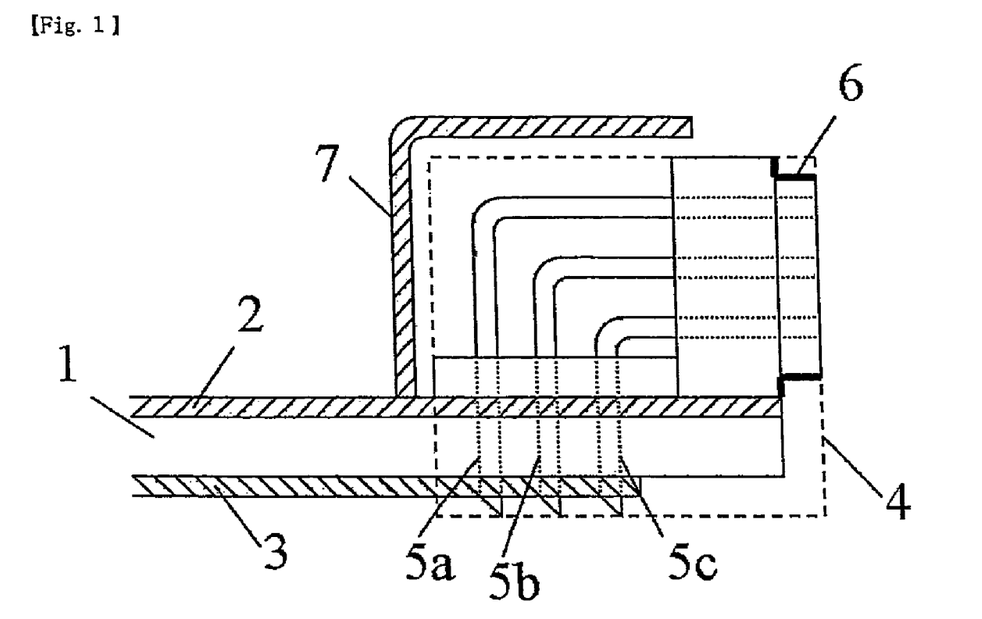
FIG. 1 is a cross-sectional view of a printed board according to the first embodiment of the invention.
Figure 2:
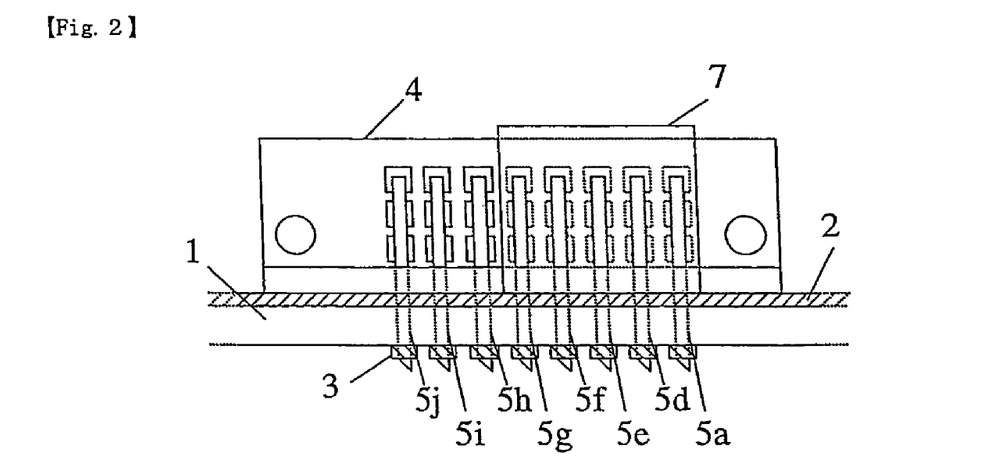
FIG. 2 is a view of the printed board of FIG. 1 as seen from the rear side of a connector.

FIG. 1 is a cross-sectional view of a printed board according to the first embodiment of the invention. FIG. 2 is a view of the same portion of the printed board as seen from the rear side of a connector 4.

On a printed board 1, the connector 4 is disposed in a horizontal orientation so that it is connected to a cable line in parallel relationship to the printed board surface. The connector 4 has a protrusion on a side surface thereof. By putting a screw through screw holes provided in the protrusion and in the printed board, the connector 4 is secured to the printed board 1. Alternatively, the connector 4 may be secured to the printed board by directly soldering the connector 4 to the printed board 1 or by soldering the protrusion on the side of the connector 4 to the printed board 1. Though FIG. 1 illustrates a structure in which the connector 4 is secured to the printed board 1 so that the insides of the two devices are connected, the connector 4 may be secured to a component other than the printed board.

The present invention is also applicable to a case where a connector is secured to a frame of a device and connecting pins between the connector and a printed board are exposed in the air. Furthermore, the present invention is applicable to a case where a connector is secured to a case or a cabinet (not shown) of devices for providing connection between the devices and connecting pins between the connector and a printed board are exposed in the air. In these cases, the connecting pins are not necessarily bent.

The printed board 1 has a ground line 2 provided on a side on which the connector 4 is mounted and signal lines 3 such as microstrip lines, strip lines and coplanar lines provided on the opposite side. The ground line 2 and the signal lines 3 are designed to have impedance matching. A plurality of connecting pins 5a, 5b and so on are extending in row and column directions from a connection of the connector 4 to a cable line and are bent at an almost right angle so that they are connected to the signal lines 3 by soldering. Portions of the connecting pins 5a, 5b and so on extending out from the connector 4 are exposed in the air. A shield case 6 is disposed at a portion where the connecting pins 5a, 5b and so on are connected to the cable line. The shield case 6 is in contact with the ground line 2.

An impedance matching member 7, which is a feature of the present invention, is disposed between the connector 4 and the printed board 1 along the exposed portions of the plurality of connecting pins 5a, 5b and so on so as to shield the exposed portions in parallel relationship to the outermost pins. The impedance matching member 7 is preferably a rectangular plate bent along the bend of the outermost pin 5a of the bent pins as shown in FIG. 1. The impedance matching member 7 is made of a conductive material such as copper, aluminum, phosphor bronze or the like, and is connected and fixed to the ground line 2 on the printed board 1 by soldering. Though the impedance matching member 7 shown in FIG. 1 and FIG. 2 covers the connecting pins 5a to 5g and do not cover the connecting pins 5h, 5i and 5j, that all of the pins are preferably covered. It is not necessary to form an insulating layer or the like on the impedance matching member 7. By forming space between the impedance matching member 7 and the connecting pins 5a, 5b and so on, the impedance matching member 7 can be insulated by an air layer. However, an insulating layer may be formed upon necessity.

Thus, the presence of the impedance matching member 7 allows the ground line to be substantially extended to the air, whereby the lines of electric force from the connecting pins 5a, 5b and so on of the connector 4 are terminated and the impedance can be reduced. Usually, the outermost pin 5a is higher in impedance than the inner pins. The impedance matching member 7 of the invention is disposed so as to be closest to the outermost pin 5a, and thus, is highly effective in reducing the impedance of the outermost pin 5a. Impedances of the connecting pins 5a, 5b and so on are determined by the distance between the respective pins and the impedance matching member 7.

Figure 3:
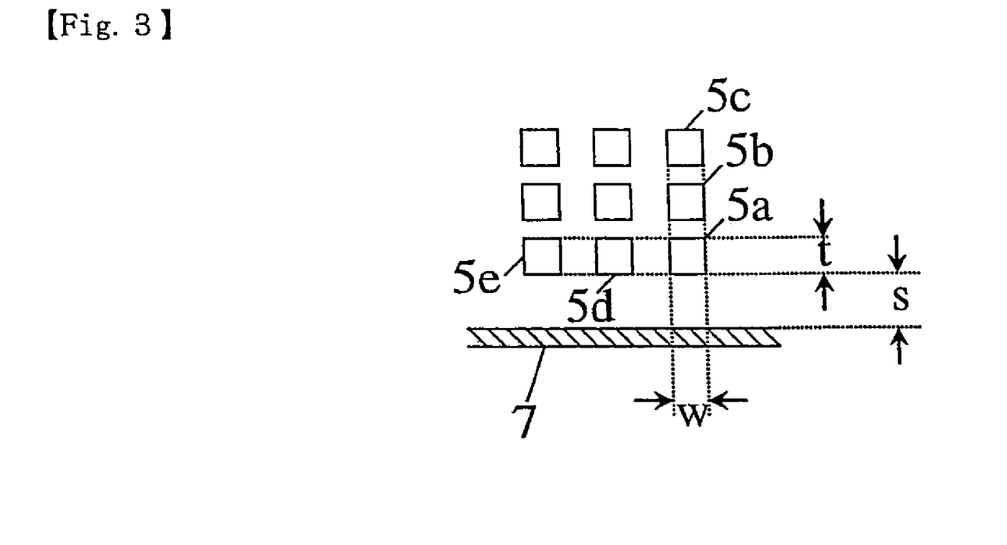
FIG. 3 is an explanatory view illustrating the positional relationship between an impedance matching member and connecting pins.

An impedance $Z_0$ of a microstrip line can roughly be determined from the following equation 2:

$$Z_0 = \frac{60}{\sqrt{0.475\varepsilon + 0.67}} \ln\left[\frac{4h}{0.67(0.8w+t)}\right] \text{ohm} \quad (2)$$

where $\varepsilon$ is a dielectric constant of the printed board and is set to 1, h is a distance between the respective signal lines and the ground layer, and w and t are cross-sectional dimensions of the outermost connecting pins 5a, 5d and so on. As shown in FIG. 3, t is a dimension in vertical direction of the outermost pins, and w is a dimension in horizontal direction of the outermost pins.

Where the impedance matching member 7 is in a plate form and is sufficiently large with respect to the connecting pins 5a, 5b and so on, the distance s between the impedance matching member 7 and the outermost connecting pins 5a, 5d and so on can approximately be determined by modifying the distance h between the signal lines and the ground line to the distance s between the impedance matching member 7 and the outermost connecting pins 5a, 5d and so on from the aforementioned equation 2. In other words, the distance s can be determined by the following equation 1.

$$s = 0.1675(0.8w+t)e^{\frac{Z_0}{56.07}} \quad (1)$$

Figure 4:
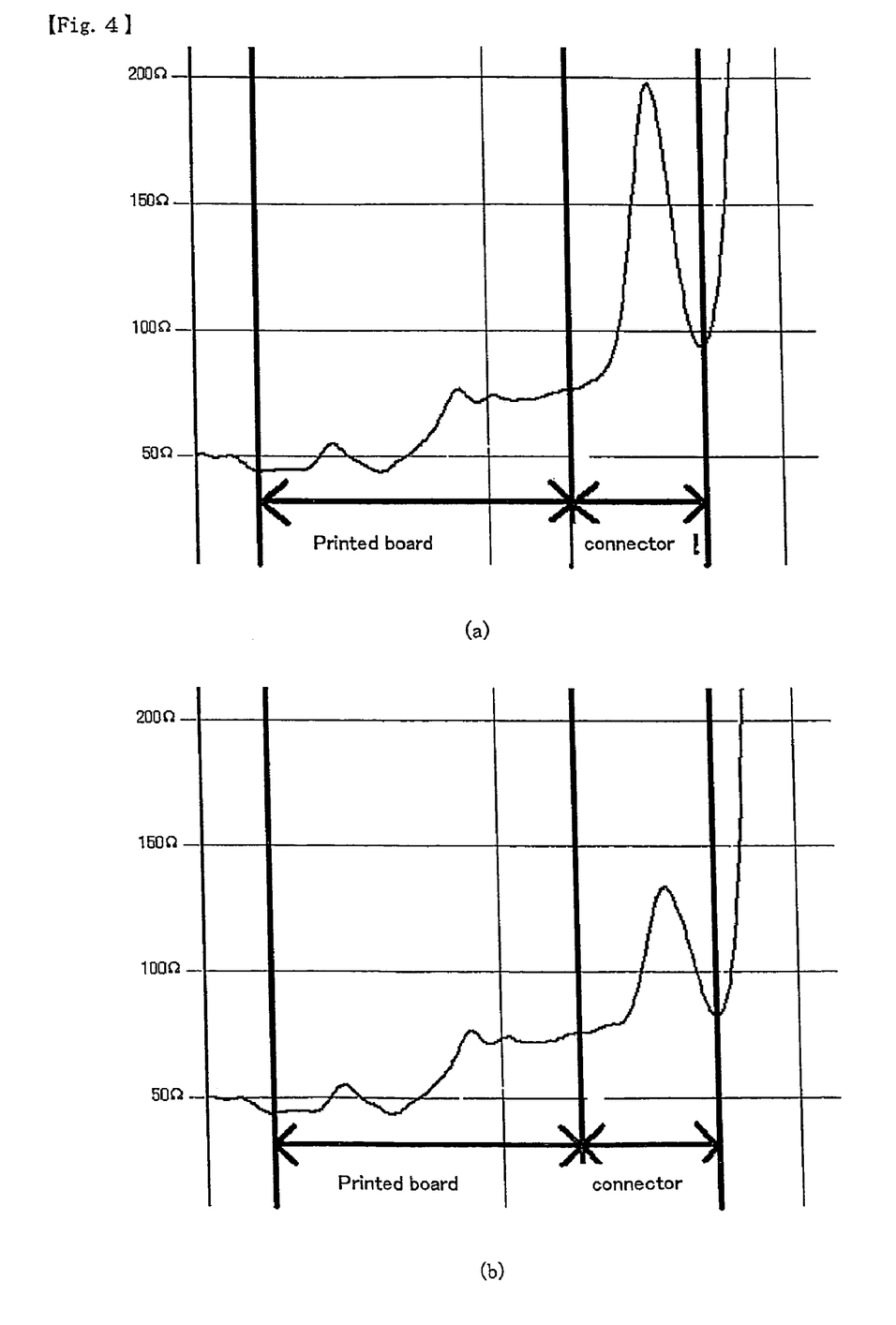
FIG. 4a is a graph illustrating the impedance characteristics of the printed board and the connector when the impedance matching member is not disposed.
FIG. 4b is a graph illustrating the impedance characteristics of the printed board and the connector when the impedance matching member is disposed.

Shown in FIG. 4b is the result of TDR measurements of common mode impedance when a plate is disposed as the impedance matching member 7. Where the impedance matching member 7 is not disposed, the impedance of the connector increases to about 200 Ω as shown in FIG. 4a. Where the impedance matching member 7 is disposed, the impedance of the connector decreases to about 135 Ω as shown in FIG. 4b. From these results, it is found that the mismatches between the common mode impedances decrease when the impedance matching member 7 is present, and thus there is less ringing. For this reason, where the wiring of the printed board needs to be designed such that a pair of differential signal lines have different lengths, for example, the effect of the present invention increases as the difference between the line lengths increases.

According to the constitution of the present invention, the impedance matching member of simple shape, for example, of rectangular shape, which is fixed to the ground line 2 by soldering or the like technique can be situated outside the connecting pins 5a, 5b and so on. This allows the present invention be simpler in shape and mounting of the impedance matching member 7 than Japanese Unexamined Patent Publication No. 2002-270307 in which the impedance matching member is disposed inside the connector 4. Thus, the impedance matching member of the present invention can be fabricated at low cost. Since the impedance matching member 7 can be disposed at very low cost, inexpensive, high-quality products can be provided to ultimate consumers.

Embodiment 2

Figure 5:
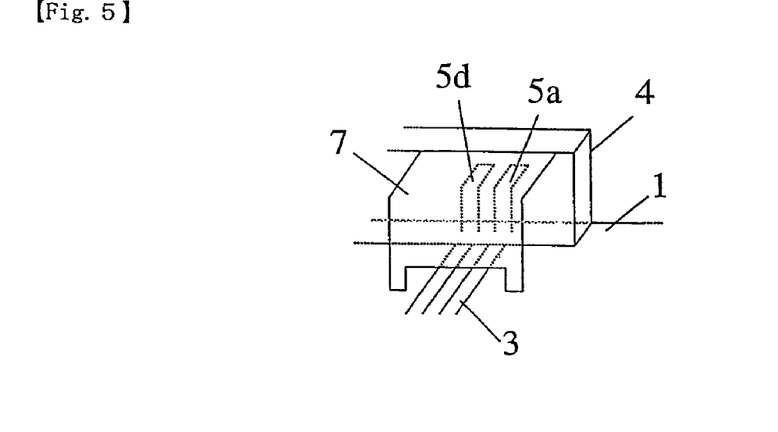
FIG. 5 is a view of a printed board according to the second embodiment of the invention.
Figure 6:
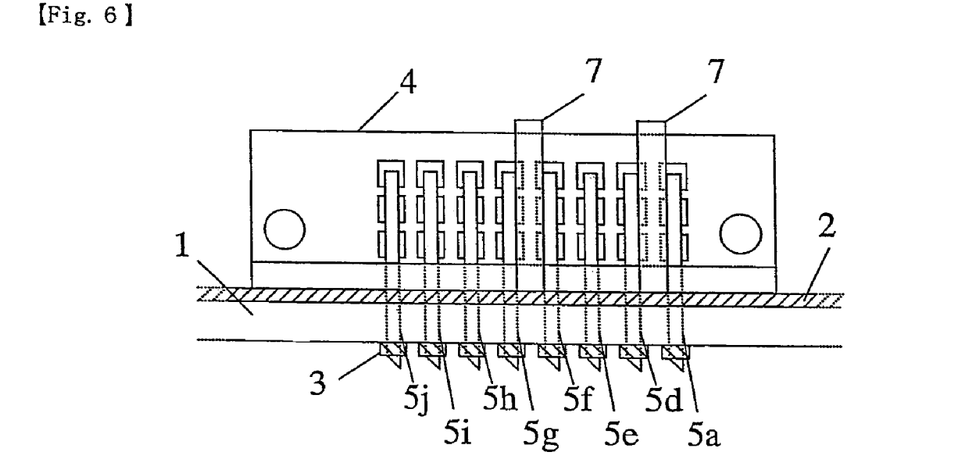
FIG. 6 is a view of another printed board according to the second embodiment of the invention.

Instead of the plate-like impedance matching member 7 illustrated in the first embodiment, a rod-like impedance matching member 7a shown in FIG. 5 or a net-like impedance matching member 7b shown in FIG. 6 may be used depending on the circumstances. When providing such impedance matching member 7 of different shape, the placement thereof needs to be considered so that the lines of electric force generated by the connecting pins are terminated as much as possible. For example, where the rod-like impedance matching member 7a is used, it is desirable that the number of rods is as large as possible, and where the net-like impedance matching member 7b is used, the net with smaller meshes can achieve a higher impedance matching effect.

Figure 7:
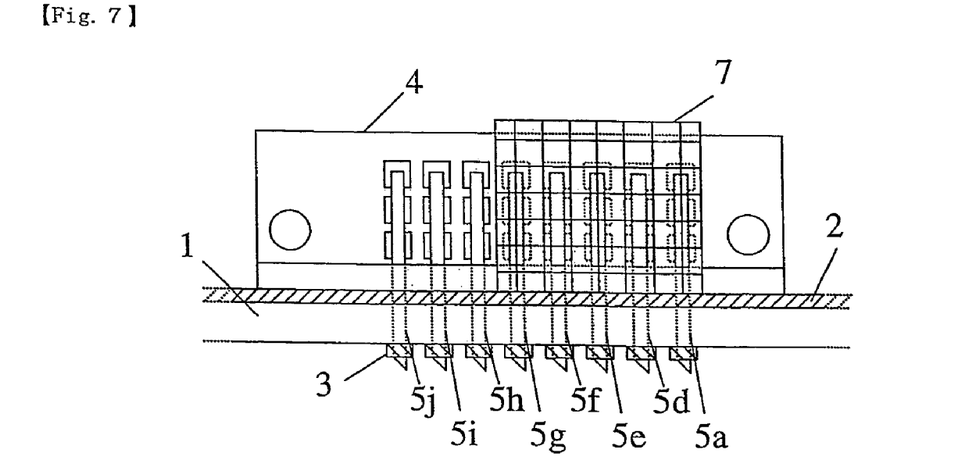
FIG. 7 is a view of still another printed board according to the second embodiment of the invention.

The impedance matching member 7 does not have to be bent along the bend of the connecting pins of the connector and may be a plate-like impedance matching member 7c standing straight as shown in FIG. 7. According to the printed board of FIG. 7, the distance s can be defined by the aforementioned equation 1.

The effect of suppressing the impedance mismatching is smaller in the printed board described in this embodiment than in the printed board illustrated in the first embodiment. Still, it is possible to provide the impedance matching member 7 of an appropriate shape in view of the required precision of transmission lines, the cost, and the space on the printed board.

Thus, the shape, material and position of the impedance matching member may be selected in accordance with how the connector is mounted on the printed board, the configurations of the connector and a device to which the printed board is mounted. Furthermore, the shape, material and position may be selected in accordance with the lines of electric force of the connecting pins, the signal intensity of the connector, printed board and other peripheral devices.

Embodiment 3

Figure 8:
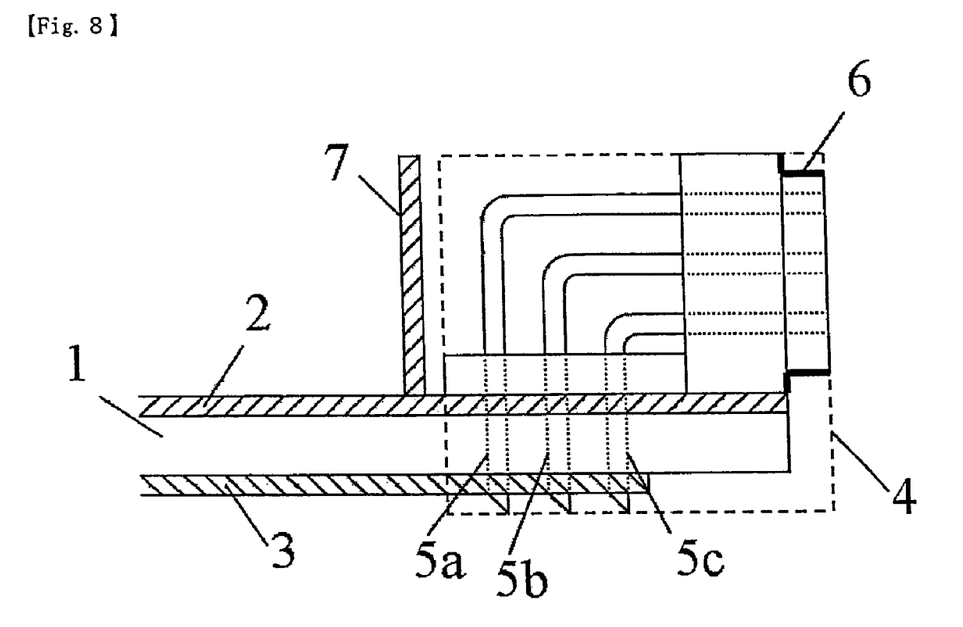
FIG. 8 is a view of a printed board according to the third embodiment of the invention.

In the third embodiment, an impedance matching member 7d has such a shape that only the connecting pins 5a, 5b, 5c, 5d and 5e which require stable transmission characteristics are covered as shown in FIG. 8. The distance s can be defined by the aforementioned equation 1. Since the connecting pins 5f, 5g, 5h, 5i and 5j are not covered with the impedance matching member 7d, the transmission characteristics of these connecting pins deteriorate. However, the size of the impedance matching member 7d can be reduced, which allows for advantages in cost and space. Thus, the impedance matching member may have different shape and size depending on the circumstances. According to the printed board of FIG. 8, where some of the connecting pins of the connector are not used for transmission of signals or where the connector includes the connecting pins 5f, 5g, 5h, 5i and 5j which only transmit signals of lower frequency than the those transmitted by the connecting pins 5a, 5b, 5c, 5d and 5e, for example, the impedance matching member 7d which corresponds to the transmission of the connector can be employed. By doing so, the cost and space of the printed board can be reduced and the impedance matching member can be provided with respect to only the signal lines which require high precision.

Embodiment 4

Figure 9:
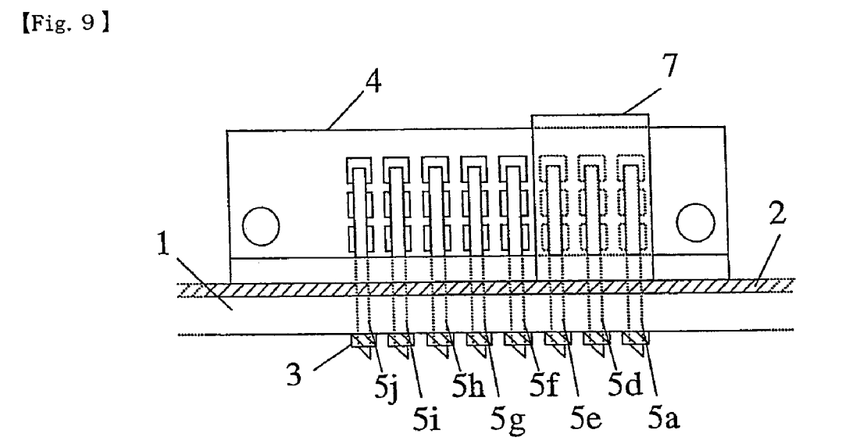
FIG. 9 is a view of a printed board according to the fourth embodiment of the invention.

When it is desired to bring an impedance matching member 7e closer to the connecting pins of the connector, the impedance matching member 7e can be bent between the connector and the printed board so that the impedance matching member can be used closer to the connecting pins 5a, 5b and so on. This allows for further reduction of impedance. The distance s can be defined by the aforementioned equation 1.

Embodiment 5

Figure 10:
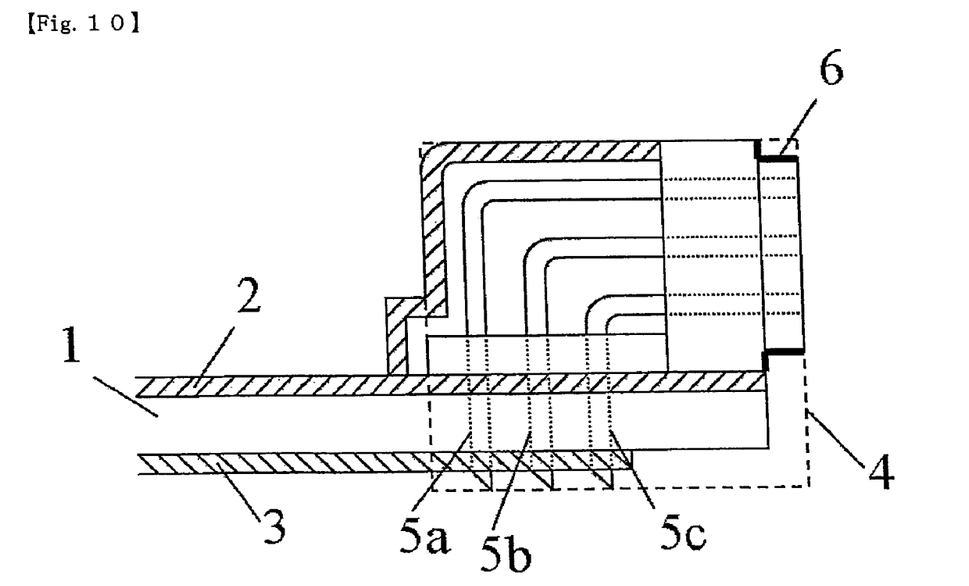
FIG. 10 is a view of a printed board according to the fifth embodiment of the invention.

As shown in FIG. 10, one end of an impedance matching member 7f farther from the printed board is connected to the shield case 6 of the connector 4 by soldering so that the impedance matching member as a ground line can have more stable characteristics, and thereby the impedance mismatching can be suppressed more effectively. The distance s can be defined by the aforementioned equation 1.

Figure 11:
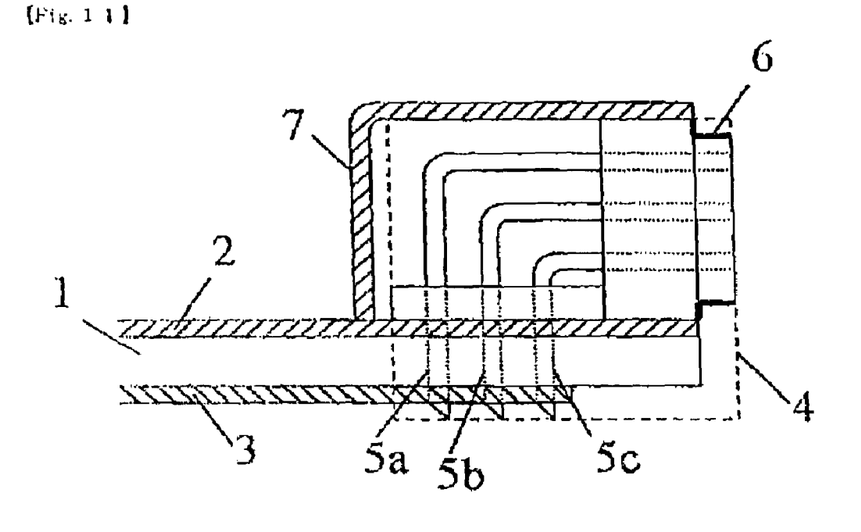
FIG. 11 is a view of a printed board according to the sixth embodiment of the invention.

Embodiment 6

Where the signal lines 3 are disposed on a side of the printed board 1 on which the connector is mounted and it is necessary to place an impedance matching member 7g above the signal lines 3, the impedance matching member 7g is provided which has such a shape that it straddles the signal lines 3 so as not to cover the signal lines 3 as shown in FIG. 11. With this construction, the impedance matching member 7g can be disposed without affecting the signal transmission characteristics of the printed board.

As described hereinabove, the impedance matching member can be disposed on the printed board to reduce the impedance mismatches. Furthermore, the impedance matching member can be modified in accordance with the required precision of the transmission lines or the circumstances so that the impedance matching member can be adapted to various purposes.

The invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A printed board comprising:
    an impedance matching member disposed along the periphery of a plurality of connecting pins for connecting a connector to signal lines on the printed board, the plurality of connecting pins being arranged in row and column direction, the entirety of the impedance matching member disposed external to the connector; and
    a connecting portion for connecting the impedance matching member to a ground line of the printed board.

2. The printed board of claim 1, wherein the impedance matching member is in the form of a conductive plate, rod or net.

3. The printed board of claim 1, wherein the signal lines on the printed board are microstrip lines, strip lines or coplanar lines.

4. The printed board of claim 1, wherein the distance s between the impedance matching member and an outermost connecting pin is defined by the following equation 1:

$$s = 0.1675(0.8w + t)e^{\frac{Z_0}{56.07}} \quad (1)$$

wherein $Z_0$ is an impedance of the outermost connecting pin when the impedance matching member is used,
t is a dimension in vertical direction of the outermost connecting pin, and
w is a dimension in horizontal direction of the outermost connecting pin.

5. The printed board of claim 1, wherein the ground line is provided on a surface of the printed board on which the connector is mounted and the signal lines are provided on the opposite surface of the printed board.

6. The printed board of claim 1, wherein the impedance matching member is disposed with respect to some of the connecting pins.

7. The printed board of claim 1, wherein the connector includes a shield case connected to the ground line of the printed board, and the impedance matching member is connected to a side of the shield case opposite to the side connected to the ground line.

8. The printed board of claim 1, wherein the signal lines are provided on a side of the printed board on which the connector is mounted, and when disposed above the signal lines, the impedance matching member straddles the signal lines.

9. The printed board of claim 1, wherein the connector is a horizontal connector mounted in a horizontal orientation so that a cable line connected to the connector is parallel to the printed board.

10. The printed board of claim 9, wherein the plurality of connecting pins are bent between the connector and the printed board, and the impedance matching member is bent along the bend of outermost connecting pins.

* * * * *